United States Patent [19]

Chow

[11] Patent Number: 5,854,560
[45] Date of Patent: Dec. 29, 1998

[54] CMOS OUTPUT BUFFER HAVING A HIGH CURRENT DRIVING CAPABILITY WITH LOW NOISE

[76] Inventor: Hwang-Cherng Chow, 4F, No. 28, San Chung Road, Chutung, Hsinchu, Taiwan, 310

[21] Appl. No.: 749,360

[22] Filed: Nov. 20, 1996

[51] Int. Cl.[6] .................. H03K 19/0948; H03K 17/16
[52] U.S. Cl. ........................... 326/27; 326/83; 326/87
[58] Field of Search ................... 326/83, 86–87, 326/17, 27, 57–58, 121

[56] References Cited

U.S. PATENT DOCUMENTS

| 4,954,729 | 9/1990 | Urai | 326/86 |
| 5,001,369 | 3/1991 | Lee | 326/87 |
| 5,124,579 | 6/1992 | Naghshineh | 326/86 |
| 5,541,541 | 7/1996 | Salamina et al. | 326/83 |

FOREIGN PATENT DOCUMENTS

| 4-371020 | 12/1992 | Japan | 326/27 |

Primary Examiner—Jon Santamauro
Attorney, Agent, or Firm—Proskauer Rose LLP

[57] ABSTRACT

In a preferred embodiment of the present invention an output buffer includes high current drivers that avoids a short circuit current. Further, the inventive output buffer only produces a slight level of ground bounce (noise). In particular, the buffer comprises first and second drivers for driving a terminal to a voltage corresponding to a high logic value of a first output signal and a low logic value of a second output signal, respectively. Typically, the first driver includes a plurality of PMOS pull-up transistors and the second driver includes a plurality of NMOS pull-down transistors. In addition, first and second predriver circuits, connected to the first and second drivers, respectively, are included. In operation, the first predriver receives the complement (inverse) of the first output signal and a delayed output of the second predriver. The second predriver receives the complement of the second output signal and the delayed output of the first predriver. In this manner, all pull-up (or pull-down) transistors are completely turned on before the pull-down (or pull-up) transistors are sequentially turned off. Therefore, a short-circuit current that may occur during a logic transition in the output signal is eliminated.

13 Claims, 5 Drawing Sheets

CMOS OUTPUT BUFFER HAVING A HIGH CURRENT DRIVING CAPABILITY WITH LOW NOISE

RELATED APPLICATION

U.S. patent application Ser. No. 08/623,350, entitled "CMOS Bidirectional Buffer Without Enable Control Signal," was filed on Mar. 28, 1996 for Hwang-Cherng Chow and U.S. application Ser. No. 08/623,583, now U.S. Pat. No. 5,708,386 entitled "CMOS Output Buffer With Reduced L·di/dt Noise," was filed on Mar. 28, 1996 for Hwang-Cherng Chow. The above-noted applications are assigned to the assignee of this application. The contents of the above-noted applications are relevant to the subject matter of this application and are fully incorporated herein by reference.

FIELD OF THE INVENTION

The present invention relates generally to CMOS integrated circuits and more particularly, it relates to an improved CMOS output buffer circuit having a high driving current while reducing noise and avoiding the occurrence of a short-circuit current.

BACKGROUND OF THE INVENTION

An integrated circuit includes internal circuitry which generates a digital output signal for transmission to other external circuits. In order to generate the requisite voltage on the output signal pins of the integrated circuit, the integrated circuit is typically provided with one or more output buffers. The output buffer has large current driving capacity transistors which can drive a terminal or pad, connected to the output signal pin, to the requisite voltage (i.e., high or low) for conveying the correct logic value (i.e., logic '1' or logic '0') of the output signal.

FIG. 1 depicts a first conventional output buffer. The to-be-outputted output signal is transferred by internal circuitry 10 to the input of one or more predriver circuits I101 or I102. Illustratively, the predriver circuits are invertors I101 and I102. The predriver I101 includes a PMOS transistor P101 and an NMOS transistor N101 connected in a standard "push-pull" invertor configuration. That is, the drains of the transistors P101 and N101 are commonly connected to the output of the predriver I101. The gates of the transistors P101 and N101 are commonly connected to the input of the predriver I101 and receive the to-be-outputted output signal from the internal circuitry 10. The source of the transistor P101 is connected to a power supply voltage $V_{DD}$ and the source of the transistor N101 is connected to a power supply voltage $V_{SS}$, where $V_{DD}$ is greater than $V_{SS}$. (Illustratively, $V_{DD}$ is also the "high" voltage level and $V_{SS}$ is the "low" voltage level. Typically, $V_{DD}$ is 3 or 5 volts, whereas $V_{SS}$ is 0 volts.) Likewise, the predriver I102 includes a PMOS transistor P102 and an NMOS transistor N102 connected in a standard "push-pull" invertor configuration.

The predriver circuits I101 and I102 output a voltage corresponding to the complement of the logic value of the output signal. Thus, if the output signal is a logic '1', the predrivers I101 and I102 output a low voltage which corresponds to a logic '0' value. Likewise, if the output signal is a logic '0', the predrivers I101 and I102 output a high logic value corresponding to a logic '1' value. The signal outputted from the predriver I101 is received, as an enable signal, at the gates of the PMOS driver transistors P103, P104 and P105. The signal outputted from the predriver I102 is received, as an enable signal, at the gates of the driver transistors N103, N104 and N105 As shown, a resistor R is connected in series between the gate of the driver transistors P103 and P104 and between the gate of the driver transistors P104 and P105. Likewise, a resistor R is connected in series between the gates of the driver transistors N103 and N104 and between the gates of the driver transistors N104 and N105. These resistors R may be formed by a resistive-conducting polycrystalline silicon gate connection that serially connects together the gates of the driver transistors P103–P105 or N103–N105.

The driver transistors P103–P105, collectively, form a large PMOS transistor with a high current driving capacity. Similarly, the driver transistors N103–N105, collectively, form a large NMOS transistor with a high current driving capacity. When enabled, the driver transistors P103–P105 drive the terminal/pad T to a high voltage (corresponding to a logic '1') by supplying current to the terminal/pad T. On the other hand, the driver transistors N103–N105, when enabled, drive the terminal/pad T to a low voltage (corresponding to a logic '0') by sinking a current from the terminal/pad T.

Consider first the steady state operation. When the output signal is logic '1', a high voltage is applied to the gates of the transistors P101, N101 of the predriver/invertor I101 and to the gates of the transistors P102, N102 of the predriver/invertor 102. Thus, transistors P1O1 and P102 are off and transistors N101 and N102 are on. A low voltage signal, corresponding to complement logic value (i.e., logic '0') of the output signal (i.e., logic '1'), is outputted from the predriver/invertors I101, I102 to the gates of the driver transistors P103–P105 and to the gates of the driver transistors N103–N105. As a result, the driver transistors P103–P105 are on and the driver transistors N103–N105 are off. The driver transistors P103–P105 drive the terminal/pad T to a high voltage corresponding to a logic '1'.

When the output signal is logic '0', a low voltage is applied to the gates of the transistors P101, N101 of the predriver/invertor I101 and to the gates of the transistors P102, N102 of the predriver/invertor 102. Thus, transistors N101 and N102 are off and transistors P101 and P102 are on. A high voltage signal, corresponding to complement logic value (i.e., logic '1') of the output signal (i.e., logic '0'), is outputted from the predriver/invertors I101, I102 to the gates of the driver transistors P103–P105 and to the gates of the driver transistors N103–N105. As a result, the driver transistors N103–N105 are on and the driver transistors P103–P105 are off. The driver transistors N103–N105 drive the terminal/pad T to a low voltage corresponding to a logic '0'.

Consider the transient operation of the output buffer when the output signal transitions its logic value, i.e., changes from a logic '0'to a logic '1' or from a logic '1' to a logic '0'. Note that in the invertor/predriver I101, the transistor P101 is larger than the transistor N101. On the other hand, in the invertor/predriver I102, the transistor N102 is larger than the transistor P102. This effects the transient response of the output buffer. Specifically, when the output signal transitions from logic '1' to logic '0', the transistor P101 turns on quickly, thereby turning the driver transistors P103–P105 off quickly. However, the transistor P102 turns on slowly. This causes the driver transistors N103–N105 to turn on more slowly than the driver transistors P103–105 turn off. Conversely, when the output signal transitions from logic '0' to logic '1', the transistors N102 turns on quickly, thereby turning the driver transistors N103–N105 off quickly. However, the transistor N101 turns on slowly, thereby causing the driver transistors P103–P105 to turn on slowly. In addition, the resistors between the gates of the driver transistors P103–P105 or in between the gates of the driver transistors N103–N105 cause the driver transistors P103–P105 or N103–N105 to slowly turn on in succession, e.g., first the transistor P103, then the transistor P104 and then the transistor P105 (due to the RC charge-up or discharge delay of the gate capacitance and resistors).

The reduction in transistor switching speed in the transient mode of operation is desirable to reduce noise. Consider that the power supply voltages $V_{DD}$ and $V_{SS}$ are supplied to all devices on the integrated circuit chip via a $V_{DD}$ or $V_{SS}$ power bus, respectively. Due to the capacitance of the terminal/pad T, the driver transistors N103–N105 and P103–P105, can produce a high instantaneous current during a high-speed transition in logic value. This high current, in turn, can impress a noise voltage on the power supply bus due to bonding wire, packaging, etc. inductances. (Note that the impressed voltage is given by v=L·di/dt, where v is the noise voltage, L is the inductance of the bonding wires, packaging, etc. and di/dt is the derivative of the current generated by the driver transistors P103–P105 or N103–N105 with respect to time. Thus, the more rapidly that the driver transistor P103–P105, N103–N105 current varies in time, the larger the magnitude of the impressed power bus noise signal.) This undesirable noise voltage on the $V_{DD}$ and $V_{SS}$ power supply buses is commonly referred to as "ground bounce". The ground bounce will be more severe if several output buffers (not shown) are simultaneously making transitions at a high operating speed. Generally, reducing the switching speed of the driver transistors, P103–P105 and N103–N105 in FIG. 1, reduces the ground bounce to the power supply busses.

FIG. 2 depicts a prior art output buffer disclosed in U.S. Pat. No. 5,063,308. The output buffer of FIG. 2 has a steady state driver 31 and a transient driver 33. In between transitions in the logic value of the output signal, the steady state driver 31 drives the terminal 29 to the appropriate logic value. When the output signal is a logic '1', the invertor 41 outputs a logic '0' or low voltage to the gate of the PMOS transistor 37 thereby turning it on so as to drive the terminal 29 to a high voltage. The invertor 43 outputs a low voltage to the gate of the NMOS transistor 35 which remains off. When the output signal is a logic '0', the invertor 43 outputs a logic '1' or high voltage to the NMOS transistor 35 thereby turning it on to drive the terminal 29 to a low voltage. Likewise, the invertor 41 outputs a high voltage to the gate of the transistor 37 which in response remains off.

The transient driver circuit 33 operates during a transition in logic state of the output signal to assist the steady state driver 31 in driving the terminal to the new voltage corresponding to the logic value to which the output signal transitions. Two Schmidt triggers ST1 and ST2 are provided for determining when the output signal transitions in logic value. Schmidt trigger ST1 includes three transistors 42a, 42b and 42c, connected in series, and a transistor 42d connected in parallel with transistors 42a and 42b. The outputs of the transistors 42a and 42b are also connected to an invertor 46a. Likewise, Schmidt trigger ST2 includes a series connection of three transistors 44a, 44b, 44c, a transistor 44d connected in parallel to the transistors 44a and 44b and an invertor 46b connected to the outputs of the transistors 44a and 44b. The Schmidt trigger ST1 monitors the voltage level at the gate of PMOS transistor 37 and the Schmidt trigger ST2 monitors the voltage at the gate of NMOS transistor 35.

Consider now a transition in logic value of the output signal from logic '1' to logic '0'. Initially, the Schmidt trigger ST2 outputs a logic '1' to the invertor 46b which, in turn, outputs a logic '0' to the NOR gate 51. The NOR gate 51 also receives the new output signal logic value '0' as a second input. The NOR gate 51 therefore outputs a logic '1' or high voltage to the gate of the transistor 38. The transistor 38 turns on and assists the transistor 35 in driving the terminal 29 to a low voltage. Meanwhile, the voltage at gate 35 charges up to $V_{DD}$. When the voltage level at the gate 35 reaches a predetermined trip level, the Schmidt trigger ST2 "trips," i.e., transitions from logic '1' to logic '0'. The invertor 46b outputs a logic '1' to the NOR gate 51 which in turn outputs a logic '0' or low voltage to the gate of NMOS transistor 38. As a result, the NMOS transistor 38 turns off.

Likewise, consider now a transition in logic value of the output signal from logic '0' to logic '1'. Initially, the Schmidt trigger ST1 outputs a logic '0' to the invertor 46a which, in turn, outputs a logic '1' to the NAND gate 49. The NAND gate 49 also receives the new output signal logic value '1' as a second input. The NAND gate 49 therefore outputs a logic '0' or low voltage to the gate of the PMOS transistor 36. The transistor 36 turns on and assists the transistor 37 in driving the terminal 29 to a high voltage. Meanwhile, the voltage at gate 37 discharges down to $V_{SS}$. When the voltage level at the gate 37 reaches a predetermined trip level, the Schmidt trigger ST1 "trips," i.e., transitions from logic '0' to logic '1'. The invertor 46a outputs a logic '0' to the NAND gate 49 which in turn outputs a logic '1' or high voltage to the gate of PMOS transistor 36. As a result, the PMOS transistor 36 turns off.

The transistors of the transient driver 33 are made larger than those of the steady state driver 31 so as to quickly discharge or charge the terminal 29 and achieve the appropriate output voltage quickly. However, because the large transistors are only turned on during a portion of the transition time, the coupling of noise onto the power busses is reduced.

The output buffer shown in FIG. 2 is disadvantageous because it requires two level trigger circuits. The use of a level trigger circuit in a buffer design can be disadvantageous because a different "trip" voltage level might be required for monitoring the gate of a PMOS transistor as opposed to monitoring the gate of an NMOS transistor. Furthermore, the design of level detector circuits to trip at precise levels can be complicated. Note also that transient drivers are turned on very soon after the output signal transitions its logic value. This tends to increase the amount of noise impressed on the power bus. Specifically, the terminal/pad is at the maximum opposite polarity voltage level ($V_{DD}$ when the transistor 38 is turned on or $V_{SS}$ when the transistor 36 turns on) at the time the larger transient driver transistor 38 or large transient driver transistor 36 turns on. Thus, a maximum driver transistor current is generated by the transient stage 33 to charge the terminal/pad up, or discharge the terminal/pad down, to the new voltage corresponding to the logic value to which the output signal transitions FIG. 3 illustrates another conventional buffer known as a tri-state output buffer. A tri-state buffer outputs either a high voltage, a low voltage or a high impedance (i.e., open circuit). The tri-state output buffer of FIG. 3 includes a NAND gate I30 having its input connected to an output signal D and an enable signal Enable, and a NOR gate 134 having its input connected to receive signal D and the inverted signal Enable (via invertor I1). The output of gates I30 and I34 are connected to the gate of PMOS device P1 and NMOS device N1, respectively. The respective source of devices P1 and N1 are connected to power supply voltage $V_{DD}$ and $V_{SS}$, respectively (where $V_{DD}$ is greater than $V_{SS}$), while the drains of P1 and N1 are commonly connected to the input of terminal/pad Q.

In operation, when signal Enable is low (logic '0'), the output buffer is in its high impedance mode, such that both P1 and N1 are off whether signal D is high or low. When signal Enable is high, then the terminal/pad Q may be driven high or low depending on whether signal D is high or low, respectively.

For example, if signal Enable is logic '1' and signal D is logic '0', NAND gate I30 outputs a logic '1' and NOR gate I34 outputs a logic '1'. Therefore, device P1 is off and device N1 is on. Accordingly, N1 drives terminal/pad Q to a low voltage corresponding to a logic '0'.

However, when the signal D transitions in logic value, there is a point in time when driver devices P1 and N1 are simultaneously on. When this occurs, a "short-circuit current" exists in the path from $V_{DD}$ to $V_{SS}$ (ground). This phenomenon occurs in the output buffer circuits of FIGS. 1 and 2, as well. This occurrence increases the power consumption in the buffer circuit. Moreover, when using large driving transistors (to generate a high driving current), the short-circuit power dissipation increases, since the switching time of the driver transistors is comparable to the logic transition time of the output signal.

It is therefore an object of the present invention to overcome the disadvantages of the prior art by providing a high drive, low noise CMOS output buffer that avoids the short-circuit current.

SUMMARY OF THE INVENTION

These and other objects are achieved by the present invention. The present invention provides an output buffer that includes high current drivers which avoid the short circuit current and the related increase in power consumption. Further, the inventive output buffer only produces a slight level of ground bounce (noise).

In particular, the buffer comprises first and second drivers for driving a terminal to a voltage corresponding to a high logic value of a first output signal and a low logic value of a second output signal, respectively. Typically, the first driver includes a plurality of PMOS pull-up transistors and the second driver includes a plurality of NMOS pull-down transistors. In addition, first and second predriver circuits, connected to the first and second drivers, respectively, are included.

In operation, the first predriver receives the complement (inverse) of the first output signal and a delayed output of the second predriver. The second predriver receives the complement of the second output signal and the delayed output of the first predriver. In this manner, all pull-up (or pull-down) transistors are completely turned on before the pull-down (or pull-up) transistors are sequentially turned off. Therefore, a short-circuit current that may occur during a logic transition in the output signal is eliminated.

In a second embodiment, the first and second drivers of the output buffer each include a plurality of NMOS transistors, i.e. the PMOS pull-up transistors are replaced with NMOS transistors. In this embodiment, the second predriver receives the delayed output of the first predriver from an invertor.

In a third embodiment, a tri-state output buffer is provided which includes first and second drivers for driving a terminal to a voltage corresponding to a high logic value of a first output signal and a low logic value of a second output signal, respectively. A first predriver circuit comprises a first logic gate having an output connected to the first driver and an input connected to an enable signal and to the output of a second logic gate. The second logic gate has an input connected to an inverted first or second output signal and a second control signal. A second predriver circuit comprises a third logic gate having an output connected to the second driver and an input connected to the inverted enable signal and to the output of a fourth logic gate. The fourth logic gate has an input connected to the inverted first or second output signal and to a first control signal. The first control signal represents a delayed output of the first logic gate and the second control signal represents a delayed output of the third logic gate.

In a fourth embodiment, a first driver comprises alternating NMOS and PMOS transistors separated in series by a first invertor. Conversely, a second driver comprises alternating PMOS and NMOS transistors separated in series by a second invertor.

In a fifth embodiment, an integrated circuit includes a terminal and driver and predriver circuits. Specifically, a plurality of first and second driver transistors are provided for driving the terminal to a voltage corresponding to a high logic value of a first output signal and to a low logic value of a second output signal, respectively. A first predriver circuit has an output connected to the first transistor in the first plurality of driver transistors and has an input to receive the complement of the first output signal and a second control signal. A second predriver circuit has an output connected to the first transistor in the second plurality of driver transistors and has an input to receive the complement of the second output signal and a first control signal. The first control signal represents a delayed output of the first predriver circuit and the second control signal represents a delayed output of the second predriver circuit.

In addition, a first plurality of logic gates, each connected in series between two sequential transistors in the first plurality of driver transistors, has an output connected to the gate of the respective transistor and has an input to receive the complement of the first output signal and the first control signal. A second plurality of logic gates, each connected in series between two sequential transistors in the second plurality of driver transistors, has an output connected to the gate of the respective transistor and has an input to receive the complement of the second output signal and the second control signal. The logic gates connected in series between the corresponding transistors function to speed up the turn-on and turn-off time of each transistor.

BRIEF DESCRIPTION OF THE DRAWING

The following detailed description, given by way of example and not intended to limit the present invention solely thereto, will best be understood in conjunction with the accompanying drawings, where similar elements will be represented by the same reference symbol, in which.

DETAILED DESCRIPTION OF THE INVENTION

Figure 1:
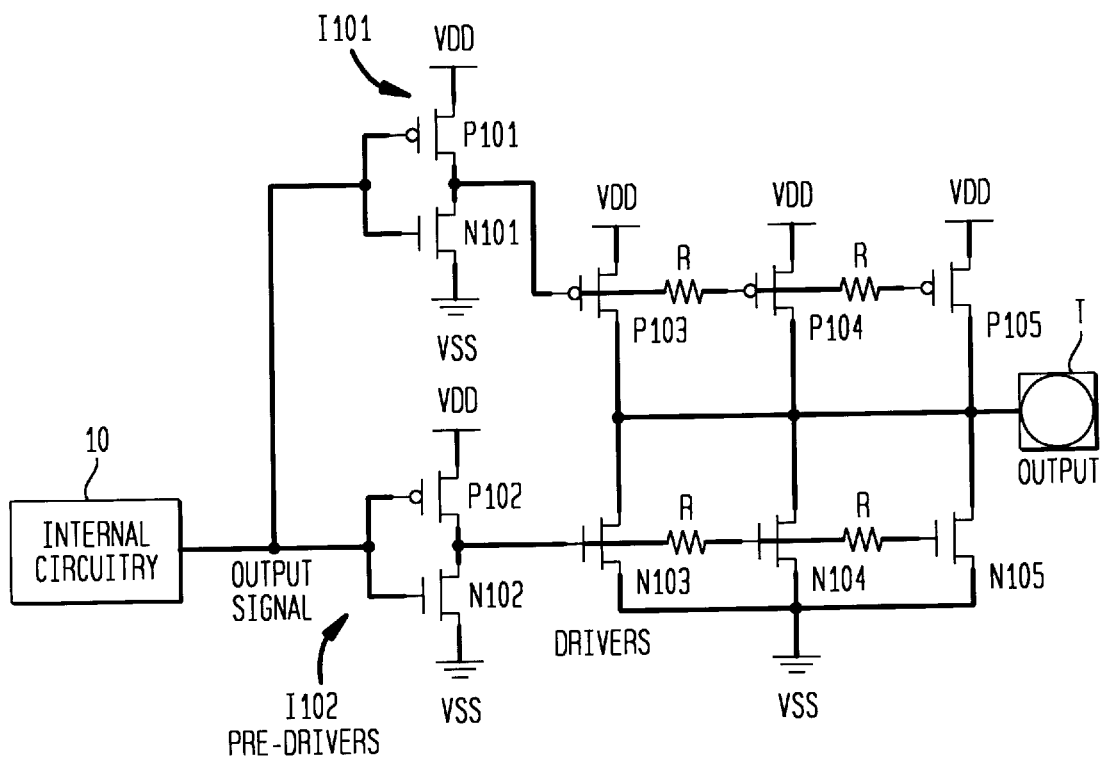
FIG. 1 shows a first conventional output buffer.
Figure 2:
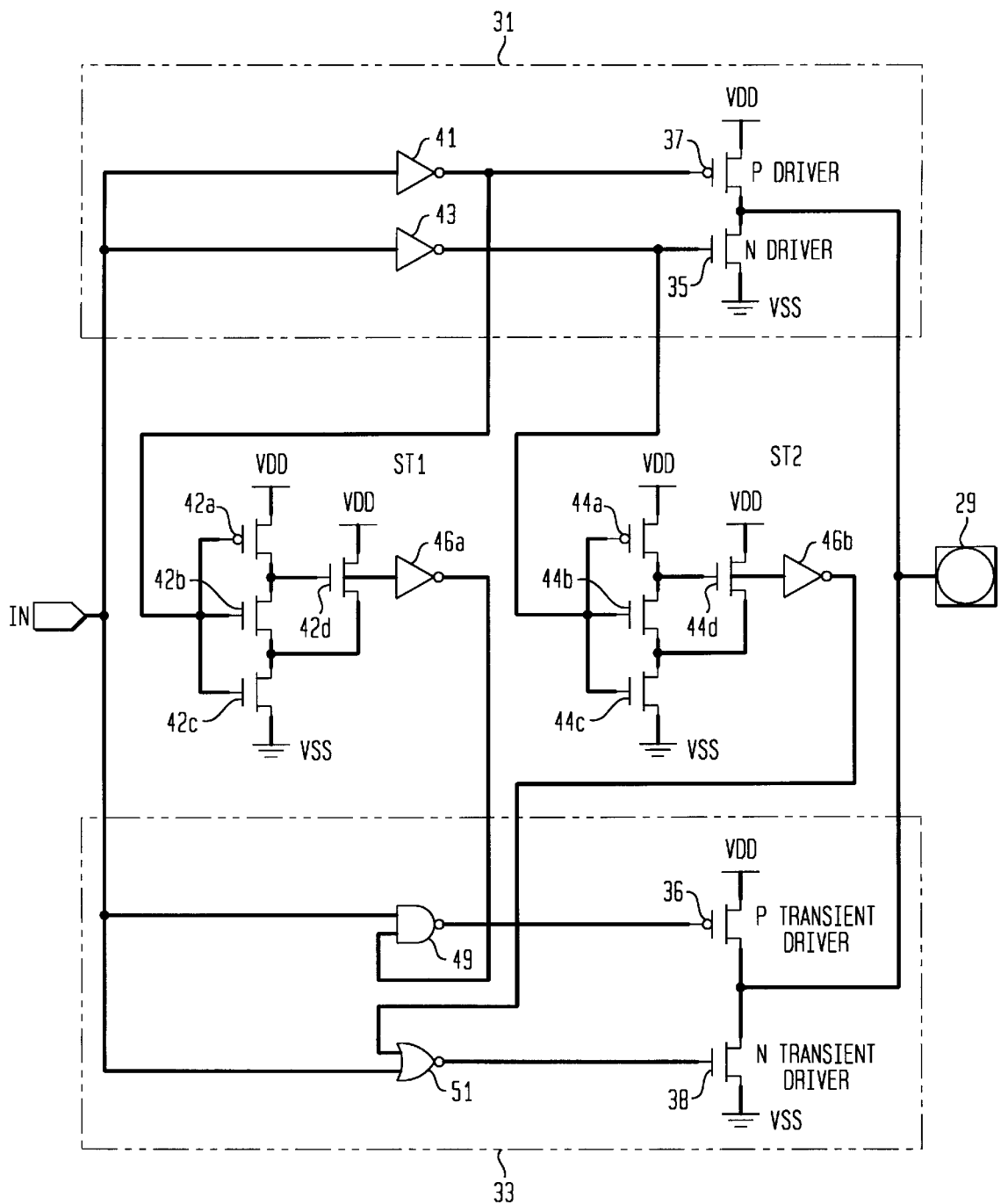
FIG. 2 shows a second conventional output buffer having separate steady state and transient drivers.
Figure 3:
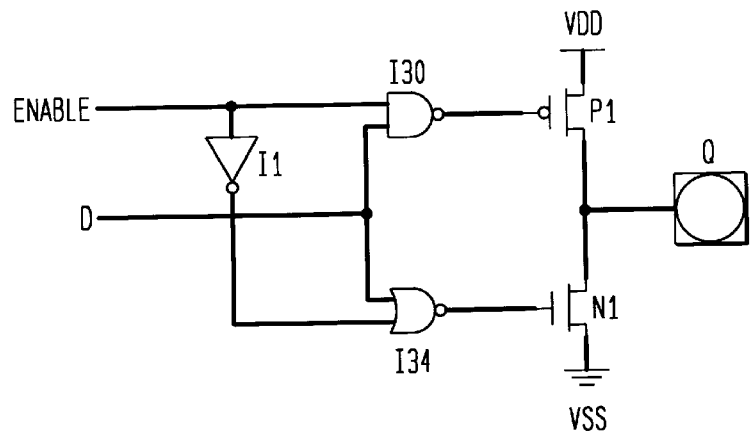
FIG. 3 shows a third conventional output buffer having a tri-state configuration.
Figure 4:
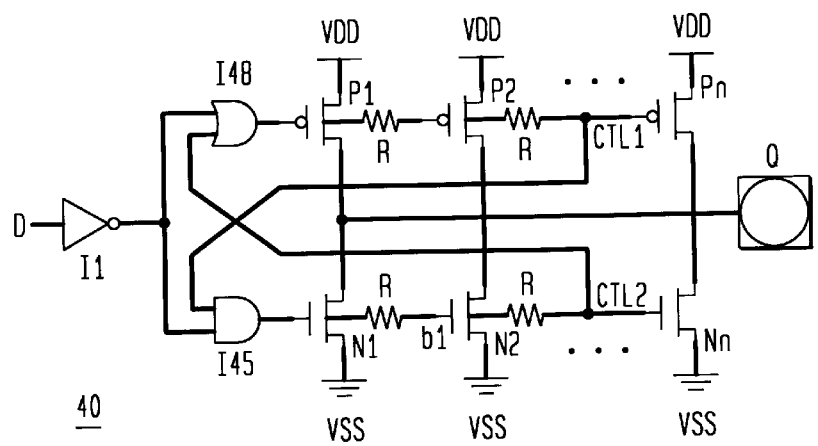
FIG. 4 shows an output buffer according to a first embodiment of the present invention.

FIG. 4 shows an output buffer 40 according to a first embodiment of the present invention. As shown, the output signal D is supplied to invertor I1. The invertor I1 receives the output signal at its input and outputs a voltage corresponding to the complement of the output signal to the inputs of OR gate I48 and AND gate I45. Illustratively, the invertor I1 includes a PMOS transistor connected to a NMOS transistor in a standard "push-pull" invertor configuration (not shown).

As stated, the OR and AND gates I48, I45, respectively, receive the inverted output signal. Further, as will be described in greater detail hereinlater, the OR and AND gates receive a respective control signal representing the delayed output from the opposite gate. Thus, OR gate I48 receives at its input the control signal representing the delayed output from AND gate I45. Conversely, AND gate I45 receives at its input the control signal representing the delayed output from OR gate I48.

The signal outputted from the OR gate I48 is received at the gates of the PMOS driver transistors P1, P2 to Pn The signal outputted from the AND gate I45 is received at the gates of the driver transistors N1, N2 to Nn. As shown, a resistor R is connected in series between the gate of each driver transistor. These resistors R may be formed by a resistive-conducting polycrystalline silicon gate connection that serially connects together the gates of the driver transistors P1–Pn or N1–Nn.

The driver transistors P1–Pn, collectively, form a large PMOS transistor with a high current driving capacity. Similarly, the driver transistors N1–Nn, collectively, form a large NMOS transistor with a high current driving capacity. When enabled, the driver transistors P1–Pn drive the terminal/pad Q to a high voltage (corresponding to a logic '1') by supplying current to the terminal/pad Q. On the other hand, the driver transistors N1–Nn, when enabled, drive the terminal/pad Q to a low voltage (corresponding to a logic '0') by sinking a current from the terminal/pad Q.

The operation of output buffer 40 will now be described. Consider when the output signal D is low, i.e., logic '0'. Thus, a low voltage is applied to invertor I1. Accordingly, a high voltage signal, corresponding to complement logic value (i.e., logic '1') of the output signal (i.e., logic '0'), is outputted from the invertor I1 to the first inputs of AND gate I45 and OR gate I48. Note that at this point, the control signals (to be inputted to the second input of gates I45, I48) representing the outputs of the opposite gates have not yet been generated. Therefore, initially the OR gate is preset to receive a logic '0' at its second input, when the output signal D is low.

Accordingly, the output of OR gate I48 is logic '1'. Thereafter, the gates of the driver transistors P1–Pn receive the logic '1' from the OR gate. As a result, the driver transistors P1–Pn are sequentially turned off. Once the logic '1' signal reaches the control node CTL1 (after being delayed by the RC delay factor due to the gate capacitance and resistors), the signal CTL1 is supplied to the second input of AND gate I45.

Since the AND gate now stores a logic '1' on both inputs, the AND gate outputs a logic '1' to the gates of the driver transistors N1–Nn. As a result, the driver transistors N1–Nn sequentially turned on (while the driver transistors P1–Pn remain off). The driver transistors N1–Nn drive the terminal/pad Q to a low voltage corresponding to a logic '0'. Note that the turn-on time of the driver transistors N1–Nn are arranged, via resistors R, to decrease the rate of change generated by the large current of the NMOS drivers to reduce ground bounce. Once all of the NMOS driver transistors are turned-on, the maximum current drive is achieved which pulls down the voltage at terminal Q to $V_{SS}$ at high speed. Since all PMOS (pull-up) driver transistors are completely turned-off before the NMOS (pull-down) driver transistors are sequentially turned-on, the short-circuit current that occurs in the $V_{DD}$ to $V_{SS}$ path, during the logic transition of the output signal D, is eliminated.

Now consider when the output signal D is high, i.e., logic '1'. Thus, a high voltage is applied to invertor I1. Accordingly, a low voltage signal, corresponding to complement logic value (i.e., logic '0') of the output signal (i.e., logic '1'), is outputted from the invertor I1 to the first inputs of AND gate I45 and OR gate I48. The output of the AND gate is logic '0' (the second input of the AND gate is preset to logic '0'). Thereafter, the gates of the driver transistors N1–Nn receive the logic '0' from the AND gate. As a result, the driver transistors N1–Nn are sequentially turned off. Once the logic '0' signal reaches the control node CTL2 (after being delayed by the RC delay factor due to the gate capacitance and resistors), the signal CTL2 is supplied to the second input of OR gate I48.

Since the OR gate now stores a logic '0' on both inputs, the OR gate outputs a logic '0' to the gates of the driver transistors P1–Pn. As a result, the driver transistors P1–Pn sequentially turned on (while the driver transistors N1–Nn remain off). The driver transistors P1–Pn drive the terminal/pad Q to a high voltage corresponding to a logic '1'. As stated above with respect to transistors N1–Nn, the turn-on time of the driver transistors P1–Pn are arranged, via resistors R, to decrease the rate of change generated by the large current of the PMOS drivers to reduce ground bounce. Once all of the PMOS driver transistors are turned-on, the maximum current drive is achieved which pulls up the voltage at terminal Q to $V_{DD}$ at high speed. Since all NMOS (pull-down) driver transistors are completely turned-off before the PMOS (pull-up) driver transistors are sequentially turned-on, the short-circuit current in the $V_{DD}$ to $V_{SS}$ path, during the logic transition of signal D, is eliminated.

Figure 5:
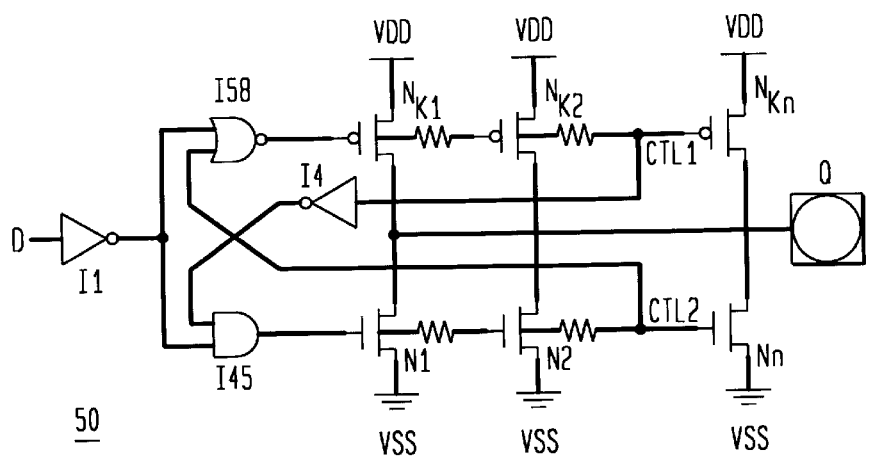
FIG. 5 shows an output buffer according to a second embodiment of the present invention.

FIG. 5 shows an output buffer 50 according to a second embodiment of the present invention. Output buffer 50 is similar to output buffer 40 of FIG. 4, except that PMOS pull-up driver transistors P1–Pn of buffer 40 are replaced by NMOS pull-up transistors Nk1–Nkn. Further, due to the supplementation of the NMOS pull-up driver transistors, OR gate 48 is replaced by NOR gate I58. Additionally, an invertor I4 is added on the path from CTL1 to the second input of AND gate I45 to compensate for the change on transistors. The operation of buffer 50 is therefore essentially similar to the operation of buffer 40, described above. Of course, similar modifications can be made to the NMOS pull-down driver transistors (by replacing them with PMOS transistors) and slightly modifying the remainder of the buffer by the addition of invertors and the like.

Figure 6:
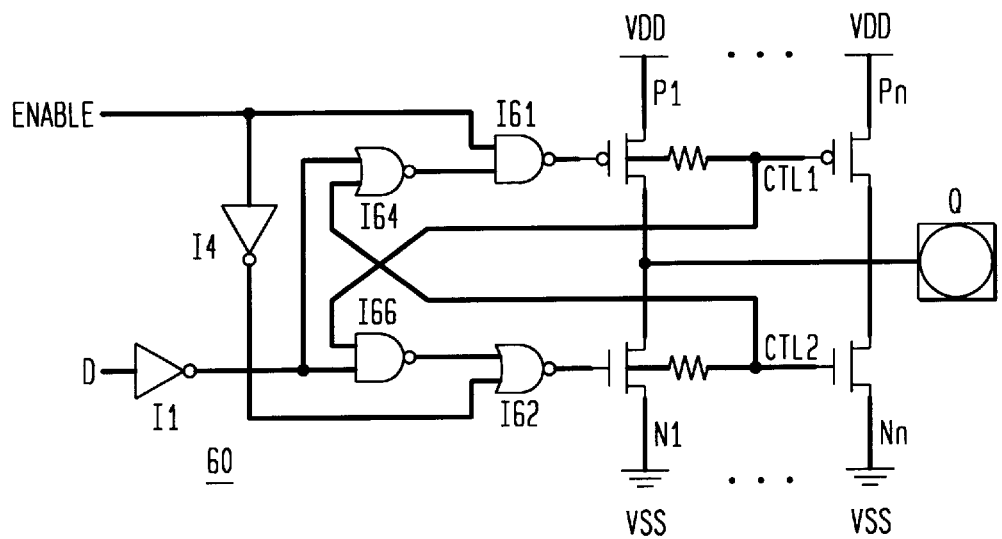
FIG. 6 shows an output buffer according to a third embodiment of the present invention.

FIG. 6 shows a tri-state output buffer 60 according to a third embodiment of the present invention. As previously stated, a tri-state buffer outputs either a high voltage, a low voltage or a high impedance (open circuit) to the terminal.

In FIG. 6, both an output signal D and enable signal Enable are supplied to buffer 60. Output signal D is supplied to invertor I1 which outputs the logic complement of signal D. The output from I1 is received by the first inputs of NOR gate I64 and NAND gate I66. The second inputs of I64 and I66 receive control signals CTL2 and CTL1, respectively, in a manner that is essentially similar to that of output buffer 40.

The outputs of NOR gate I64 and NAND gate I66 are supplied to the first inputs of NAND gate I61 and NOR gate I62, respectively. The second input of I61 receives the signal Enable, while the second input of I62 receives the inverted signal Enable via invertor I4. The output from I61 is supplied to the gates of the PMOS driver transistors P1–Pn and the output from I62 is supplied to the gates of the NMOS driver transistors N1–Nn.

In operation, when signal Enable is low (logic '0') output buffer 60 is in its high impedance mode, such that both the pull-up and pull-down driver transistors, P1–Pn and N1–Nn, are off whether signal D is high (logic '1') or low (logic '0'), then both PMOS and NMOS transistors are on. When signal Enable is high, then the terminal/pad Q may be driven high or low depending on whether signal D is high or low, respectively, in a manner similar to that of output buffer 40, described above.

Figure 7:
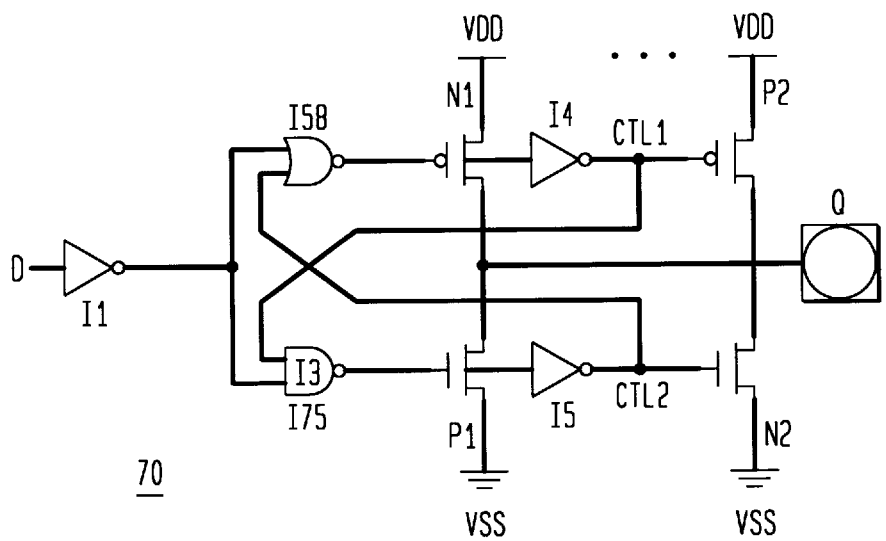
FIG. 7 shows an output buffer according to a fourth embodiment of the present invention.

FIG. 7 shows an output buffer 70 according to a fourth embodiment of the present invention. Output buffer 70 is similar to output buffer 40 of FIG. 4, except that the pull-up driver transistors alternate from NMOS N1 to PMOS P2 devices. Similarly, the pull-down driver transistors alternate from PMOS P1 to NMOS N2 devices. To compensate for the alternating CMOS devices, invertors I4 and I5 are connected between the pull-up and pull-down transistors, respectively. Of course, additional driver transistors can be added, as desired. In addition, the OR gate I48 and AND gate I45 of buffer 40 is replaced by NOR gate I58 and NAND gate I75, respectively. The operation of buffer 70 is essentially similar to that of buffer 40 and therefore will not be redescribed.

Figure 8:
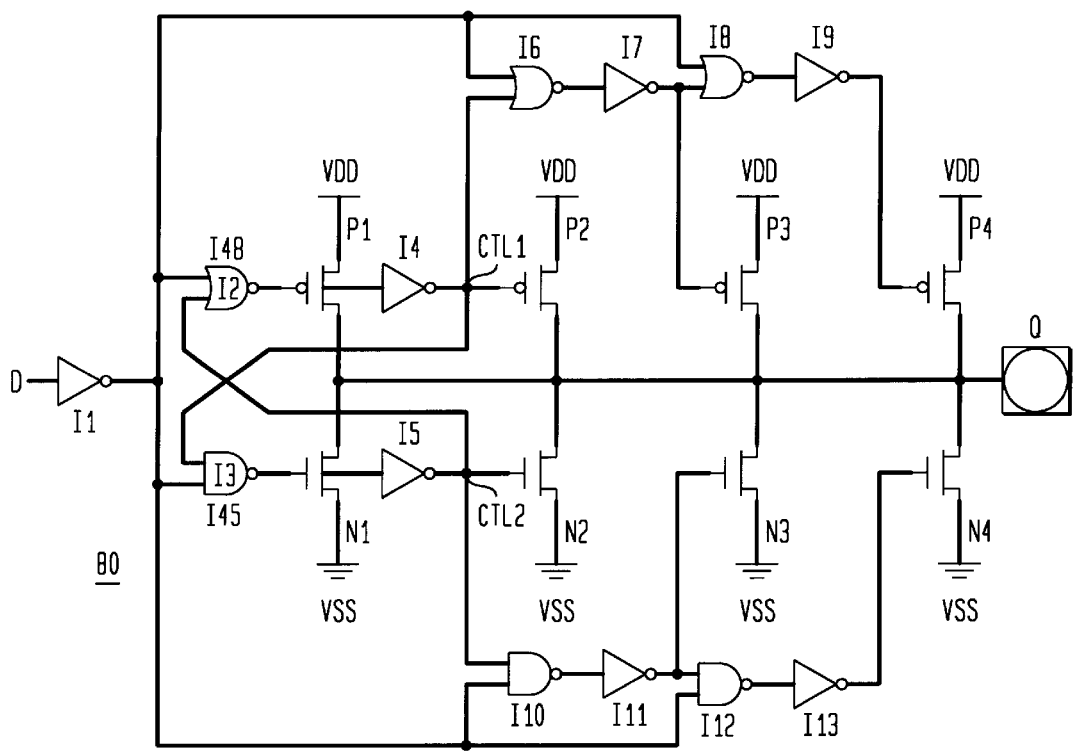
FIG. 8 shows an output buffer according to a fifth embodiment of the present invention.

FIG. 8 shows an output buffer 80 according to a fifth embodiment of the present invention. Essentially, buffer 80 comprises buffer 40 of FIG. 4 with additional logic gates to speed up the switching operation of each driver transistor.

In particular, buffer 80 adds a NOR gate in series with an invertor connected to the gates of every two consecutive pull-up driver transistors P2–P4 (additional PMOS transistors may be added as desired). For example, NOR gate I6 is connected to the gate of P2 and invertor I7 is connected to the gate of P3. Similarly, NOR gate I8 is connected to the gate of P3 and invertor I9 is connected to the gate of P4. NOR gate I6 receives the inverted output signal D (via invertor I1) at its first input and receives signal CTL1 (via delay I4) at its second input. NOR gate I8 also receives the inverted output signal D (via invertor I1) at its first input and receives the output of invertor I7 at its second input.

On the other hand, buffer 80 adds a NAND gate in series with an invertor connected to the gates of every two consecutive pull-down driver transistors N2–N4 (additional NMOS transistors may be added as desired). For example, NAND gate I10 is connected to the gate of N2 and invertor I11 is connected to the gate of N3. Similarly, NAND gate I12 is connected to the gate of N3 and invertor I13 is connected to the gate of N4. NAND gate I10 receives the inverted output signal D (via invertor I1) at its first input and receives signal CTL2 (via delay I5) at its second input. NAND gate I12 also receives the inverted output signal D (via invertor I1) at its first input and receives the output of invertor I11 at its second input.

The operation of buffer 80 is similar to that of buffer 40. However, the logic gate/invertor pairs speed up the turn-off and turn-on speeds of their corresponding driver transistors. In this embodiment, a logic gate/invertor pair is not connected between transistors P1, P2 or N1, N2. Thus, the path from P1 to P2 requires the longest amount of time in the pull-up driver transistors, and similarly, the path from N1 to N2 requires the longest amount of time in the pull-down driver transistors. This is to ensure that all of the pull-up (or pull-down) driver transistors are off before the pull-down (or pull-up) driver transistors are on.

Finally, the above-discussion is intended to be merely illustrative of the invention. Numerous alternative embodiments may be devised by those having ordinary skill in the art without departing from the spirit and scope of the following claims.

The claimed invention is:

1. An output buffer, comprising:

a first driver, comprising a plurality of pull-up CMOS transistors, each separated by one of a respective resistor and invertor, for driving a terminal to a voltage corresponding to a high logic value of a first output signal, said plurality of pull-up transistors activate sequentially with an R-C delay from said one of a respective resistor and invertor when the output from said second predriver is low;

a second driver, comprising a plurality of pull-down CMOS transistors, each separated by one of a respective resistor and invertor, for driving said terminal to a voltage corresponding to a low logic value of a second output signal, said plurality of pull-down transistors activate sequentially with an R-C delay from said one of a respective resistor and invertor when the output from said first predriver is high;

a first predriver circuit, connected to said first driver; and a second predriver circuit, connected to said second driver, wherein said first predriver receives the complement of said first output signal and a delayed output of said second predriver, and said second predriver receives the complement of said second output signal and the delayed output of said first predriver, and wherein said delayed output of said first and second predriver circuits being delayed by said R-C delay.

2. The output buffer of claim 1, wherein said first and second predrivers comprise at least one of an AND, NAND, OR and NOR gate.

3. The output buffer of claim 1, wherein said pull-up and pull-down transistors are activated sequentially with said delay to avoid a ground bouncing effect.

4. The output buffer of claim 1, wherein said complement of said first output signal and said complement of said second output signal are supplied to corresponding said first and second predrivers from an invertor.

5. The output buffer of claim 1, wherein said pull-up and pull-down transistors comprise a plurality of PMOS and NMOS transistors, respectively.

6. The output buffer of claim 1, wherein said pull-up and pull-down transistors comprise a plurality of NMOS transistors, and wherein said second predriver receives said delayed output of said first predriver from an invertor.

7. The output buffer of claim 1, wherein said pull-up transistors comprise first and second CMOS devices separated in series by said respective invertor, and said pull-down transistors comprise third and fourth CMOS devices separated in series by said respective invertor.

8. The output buffer of claim 7, wherein said first and fourth CMOS devices are NMOS transistors and said second and third CMOS devices are PMOS transistors.

9. An tri-state output buffer, comprising:

a first driver, comprising a plurality of pull-up CMOS transistors, each separated by a respective resistor, for driving a terminal to a voltage corresponding to a high logic value of a first output signal, said plurality of pull-up transistors activate sequentially with an R-C delay from said respective resistor when the output from said second predriver is low;

a second driver, comprising a plurality of Pull-down CMOS transistors, each separated by a respective resistor, for driving said terminal to a voltage corresponding to a low logic value of a second output signal, said plurality of pull-down transistors activate sequentially with an R-C delay from said respective resistor when the output from said first predriver is high;

a first predriver circuit comprising a first logic gate having an output connected to said first driver and an input connected to an enable signal and to the output of a second logic gate, said second logic gate having an input connected to an inverted first or second output signal and to a second control signal; and a second predriver circuit comprising a third logic gate having an output connected to said second driver and an input connected to the inverted enable signal and to the output of a fourth logic gate, said fourth logic gate having an input connected to said inverted first or second output signal and to a first control signal, wherein said first control signal represents a delayed output of said first logic gate, and said second control signal represents a delayed output of said third logic gate, and wherein said delayed output of said first and second logic gates being delayed by said R-C delay.

10. The tri-state output buffer of claim 9, wherein said first and fourth logic gates are NAND gates and said second and third logic gates are NOR gates.

11. An integrated circuit, comprising:

a terminal;

a first plurality of driver transistors for driving said terminal to a voltage corresponding to a high logic value of a first output signal;

a second plurality of driver transistors for driving said terminal to a voltage corresponding to a low logic value of a second output signal;

a first predriver circuit having an output connected to the first said transistor in said first plurality of driver transistors and having an input to receive the complement of said first output signal and a second control signal;

a second predriver circuit having an output connected to the first said transistor in said second plurality of driver transistors and having an input to receive the complement of said second output signal and a first control signal, wherein said first control signal represents a delayed output of said first predriver circuit, and said second control signal represents a delayed output of said second delayed output circuit;

a first plurality of logic gates, each connected in series between two sequential transistors in said first plurality of driver transistors, having an output connected to the gate of the respective transistor, wherein the first logic gate of said first plurality of logic gates has an input to receive said complement of said first output signal and said first control signal; and a second plurality of logic gates, each connected in series between two sequential transistors in said second plurality of driver transistors, having an output connected to the gate of the respective transistor, wherein the second logic gate of said second plurality of logic gates has an input to receive said complement of said second output signal and said second control signal.

12. The integrated circuit of claim 11, wherein each logic gate of said first and second plurality of logic gates is connected in series with an invertor.

13. The integrated circuit of claim 12, wherein none of said first plurality of logic gates is connected between the respective first two said sequential transistors in said first plurality of driver transistors, and wherein none of said second plurality of logic gates is connected between the respective first two said sequential transistors in said second plurality of driver transistors.

* * * * *

UNITED STATES PATENT AND TRADEMARK OFFICE
CERTIFICATE OF CORRECTION

PATENT NO. : 5,854,560
DATED : December 29, 1998
INVENTOR(S) : Hwang-Cherng CHOW It is certified that error appears in the above-indentified patent and that said Letters Patent is hereby corrected as shown below:

```
On the title page, insert the following Assignee:
        Industrial Technology Research Institute
```

Signed and Sealed this

Twenty-eighth Day of September, 1999

Attest:

Q. TODD DICKINSON

*Attesting Officer*        *Acting Commissioner of Patents and Trademarks*